United States Patent [19]

Nagahira et al.

[11] Patent Number: 5,610,810
[45] Date of Patent: Mar. 11, 1997

[54] APPARATUS FOR CORRECTING ERRORS IN A DIGITAL-TO-ANALOG CONVERTER

[75] Inventors: Jyoji Nagahira, Tokyo; Koji Suzuki, Yokohama; Kouki Kuroda, Tokyo, all of Japan

[73] Assignee: Canon Kabushiki Kaisha, Tokyo, Japan

[21] Appl. No.: 390,284

[22] Filed: Feb. 15, 1995

Related U.S. Application Data

[63] Continuation of Ser. No. 983,248, Nov. 30, 1992, abandoned, which is a continuation of Ser. No. 607,637, Oct. 31, 1990, abandoned, which is a continuation of Ser. No. 185,275, Apr. 18, 1988, abandoned, which is a continuation of Ser. No. 847,517, Apr. 3, 1986, abandoned, which is a continuation of Ser. No. 776,498, Sep. 13, 1985, abandoned, which is a continuation of Ser. No. 412,809, Aug. 30, 1982, abandoned.

[30] Foreign Application Priority Data

| Sep. 6, 1981 | [JP] | Japan | 56-140863 |
| Sep. 9, 1981 | [JP] | Japan | 56-140862 |
| Sep. 9, 1981 | [JP] | Japan | 56-140864 |
| Sep. 9, 1981 | [JP] | Japan | 56-140865 |

[51] Int. Cl.⁶ .......................... G06F 19/00; G05B 15/02
[52] U.S. Cl. ...................... 364/167.01; 318/562
[58] Field of Search ............................ 341/120; 324/537, 324/130; 371/24, 25.1; 340/347; 395/800; 318/35–52, 105–113, 562, 565; 364/167.01

[56] References Cited

U.S. PATENT DOCUMENTS

| 3,027,079 | 3/1962 | Fletcher et al. | 340/347 AD |
| 3,108,272 | 10/1963 | Sweeney | 341/110 X |
| 3,603,772 | 9/1971 | Paine et al. | 341/110 X |
| 3,643,146 | 2/1972 | Ferguson et al. | 318/565 |
| 3,701,888 | 10/1972 | McDaniel | 318/562 |
| 3,742,324 | 6/1973 | Gross et al. | 318/591 |
| 3,816,813 | 6/1974 | Jehu | 371/24 |
| 3,818,301 | 6/1974 | Sindelar | 318/574 |
| 3,911,316 | 10/1975 | Feick et al. | 318/562 |
| 4,078,192 | 3/1978 | Fulz | 318/799 |
| 4,087,729 | 5/1978 | Yamazaki et al. | 318/601 |
| 4,132,937 | 1/1979 | Engelberger et al. | 395/80 |
| 4,149,256 | 4/1979 | Sumi et al. | 341/110 X |
| 4,198,677 | 4/1980 | Bruner et al. | 340/347 CC X |
| 4,217,530 | 8/1980 | Dahm | 318/623 |
| 4,225,940 | 9/1980 | Moriyasu et al. | 341/110 X |
| 4,229,703 | 10/1980 | Bustin | 341/118 X |
| 4,266,292 | 5/1981 | Regon | 371/25.1 |
| 4,272,760 | 6/1981 | Prazak et al. | 341/120 |
| 4,280,196 | 7/1981 | Hornak et al. | 340/347 CC X |
| 4,316,178 | 2/1982 | Shibayama et al. | 341/118 |
| 4,324,499 | 4/1982 | Giacone | 400/144.2 |
| 4,337,456 | 6/1982 | Deffendal et al. | 340/347 AD X |
| 4,340,882 | 7/1982 | Maio et al. | 340/347 CC |
| 4,342,077 | 7/1982 | Passey et al. | 364/183 |
| 4,344,067 | 8/1982 | Lee | 340/347 CC |
| 4,345,241 | 8/1982 | Takeuchi et al. | 340/347 CC |
| 4,353,020 | 10/1982 | Veale | 318/601 |
| 4,364,027 | 12/1982 | Murooka | 340/347 CC |
| 4,369,432 | 1/1983 | Mikami | 341/120 |
| 4,380,005 | 4/1983 | Debord et al. | 340/347 CC X |
| 4,381,495 | 4/1983 | Hotta | 340/347 DA |
| 4,399,426 | 8/1983 | Tan | 341/120 |
| 4,403,175 | 9/1983 | Ruumpol | 318/53 |
| 4,547,762 | 10/1985 | Ono | 341/144 X |
| 4,571,725 | 2/1986 | Nagashima et al. | 341/120 X |

OTHER PUBLICATIONS

Beck, "Direct Digital–to–Analog Values Storage," IBM Technical Disclosure Bulletin, vol. 9, No. 4, Sep. 1966.
Kennedy, "Calibration of Analog Channels," IBM Technical Disclosure Bulletin, vol. 16, No. 9, Feb. 1974.

*Primary Examiner*—Thomas G. Black
*Assistant Examiner*—Paul R. Lintz
*Attorney, Agent, or Firm*—Fitzpatrick, Cella, Harper & Scinto

[57] ABSTRACT

Adjustment of a gain and an offset of a data processing apparatus for controlling the operation of a copying machine or the like can be performed all at once without requiring adjustment of individual components making up the apparatus, such as an A/D converter. Changes in the gain and/or offset of the apparatus which occur with time can be compensated for. Data fetch and output can be efficiently performed.

10 Claims, 6 Drawing Sheets

APPARATUS FOR CORRECTING ERRORS IN A DIGITAL-TO-ANALOG CONVERTER

This application is a continuation of application Ser. No. 07/983,248 filed Nov. 30, 1992, now abandoned, which was a continuation of application Ser. No. 07/607,637 filed Oct. 31, 1990, now abandoned, which was a continuation of application Ser. No. 07/185,275 filed Apr. 18, 1988, now abandoned, which was a continuation of application Ser. No. 06/847,517 filed Apr. 3, 1986, now abandoned, which was a continuation of application Ser. No. 06/776,498 filed Sep. 13, 1985, now abandoned, which was a continuation of application Ser. No. 06/412,809 filed Aug. 30, 1982, now abandoned.

BACKGROUND OF THE INVENTION

1. Field of the Invention

The present invention relates to a data processing apparatus which effectively performs data fetch and data output in a digital processor comprising a microprocessor or the like which performs control of operation of a copying machine.

2. Description of the Prior Art

In a digital processor of this type, adjustment of the gain and the difference (the latter to be referred to as an offset hereinafter) between the input value and the recognized value in analog to digital conversion is performed through adjustment of, for example, a variable resistor in an analog-to-digital converter (A/D converter) of the processor. If such adjustment with a variable resistor or the like is not performed, the A/D converter must have a high precision. Adjustment of the offset and gain by means of the A/D converter is performed through calibration of the input section of the A/D converter. Therefore, if a level shift circuit is incorporated in the stage preceding the A/D converter, not only the A/D converter but also the level shift circuit must be calibrated.

Adjustment of the gain of the analog input to the digital processor must be performed in accordance with the difference between the respective gains of the A/D converter, the multiplexer and so on which make up the digital processor. Such adjustment is cumbersome.

If an analog signal must be produced from a digital processor, the offset calibration (reference value setting) and gain adjustment must be performed at the output side.

Adjustment of the reference value and gain for obtaining the digital output from the digital processor is conventionally performed through adjustment of a variable resistor incorporated in a D/A converter of the processor. If such adjustment is not performed, the D/A converter must have a high precision. Adjustment of the reference value and gain by means of the D/A converter is performed by calibration at the output side of the D/A converter. Therefore, if a driver circuit or the like is incorporated at the stage next to the D/A converter, the adjustment must be performed for the driver circuit or the like as well as for the D/A converter.

In addition, the adjustment of the reference value and the gain of the digital output from the digital processor must be performed in accordance with the difference between the gains of the D/A converter, the multiplexer and so on.

SUMMARY OF THE INVENTION

The present invention has been made in consideration of this and has for its object to provide a data processing apparatus which allows correct A/D conversion input and D/A conversion output in a digital processor which controls the operation of a copying machine or the like.

It is another object of the present invention to provide a data processing apparatus which allows, for an input analog signal, adjustment of an offset of the overall apparatus independently of the difference in the offsets of the individual circuits making up the apparatus.

It is another object of the present invention to provide a data processing apparatus which allows, for an input analog signal, calibration of the gain of the overall apparatus independently of the difference in the gains of the individual circuits making up the apparatus.

It is still another object of the present invention to provide a data processing apparatus which allows, for an output digital signal, calibration of a reference value of the overall apparatus independently of the difference in reference values of the individual circuits making up the apparatus.

It is still another object of the present invention to provide a data processing apparatus which allows, for an output digital signal, calibration of the gain of the overall apparatus independently of the difference in the gains of the individual circuits making up the apparatus.

It is still another object of the present invention to provide a data processing apparatus suitably adapted for control of a high voltage source, a light source, a heat source, or the like of a copying machine.

The above and other objects of the present invention will become apparent from the following detailed description.

DETAILED DESCRIPTION OF THE PREFERRED EMBODIMENTS

The preferred embodiment of the present invention will now be described in detail with reference to the accompanying drawings.

Figure 1:
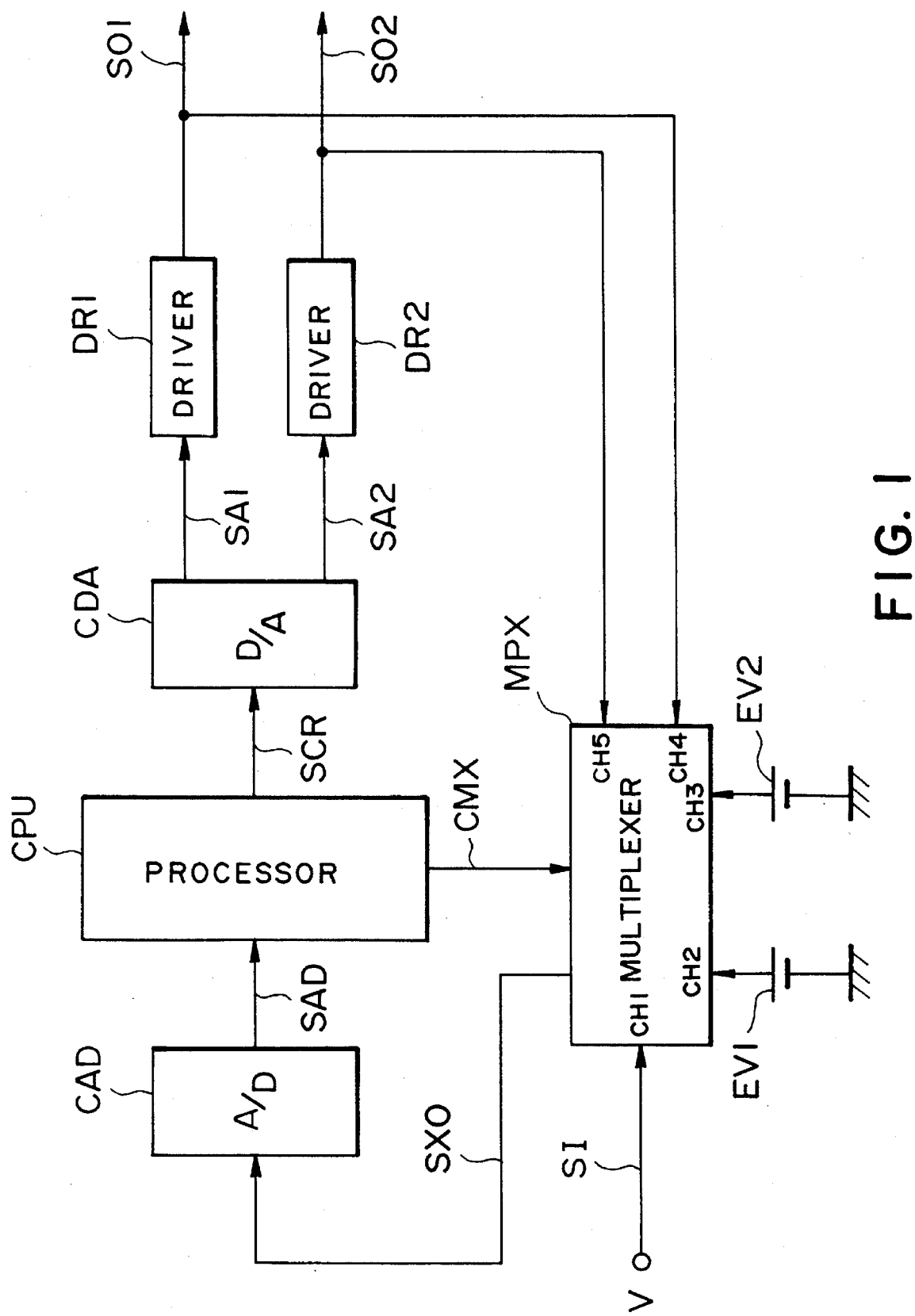
FIG. 1 is a block diagram of a data processing apparatus for performing analog-to-digital conversion and digital-to-analog conversion according to the present invention.

FIG. 1 shows a data processing apparatus having an analog-to-digital converter (A/D converter) and a digital-to-analog converter (D/A converter) according to the present invention. A multiplexer MPX has five input channels CH1 to CH5. The channel CH1 receives an analog input signal SI such as a power source voltage, an operation signal of a driven part, a detection signal or the like. The channels CH2 and CH3 respectively receive reference voltages EV1 and EV2 ($\neq$EV1). The switching operation of the multiplexer MPX is performed on the basis of a control signal CMX from an operation processing unit CPU which comprises a known one-chip microcomputer. The multiplexer MPX supplies a selected output signal SXO to an A/D converter CAD. A converted digital signal SAD from the A/D converter CAD is supplied to the operation processing unit CPU as a digital processor which performs necessary operations. A digital signal SCR obtained by the processing at the operation processing unit CPU is supplied to a D/A converter CDA to be converted into analog signals SA1 and SA2 which are respectively supplied to output drivers DR1 and DR2. The output drivers DR1 and DR2 perform output control of the high voltage transformer and drive control of the motor, lamp and so on of a copying machine and the like. Meanwhile, output signals SO1 and SO2 from the output drivers DR1 and DR2 are produced as output signals from the apparatus and are also supplied to the channels CH4 and CH5, respectively, of the multiplexer MPX.

Figure 2A:
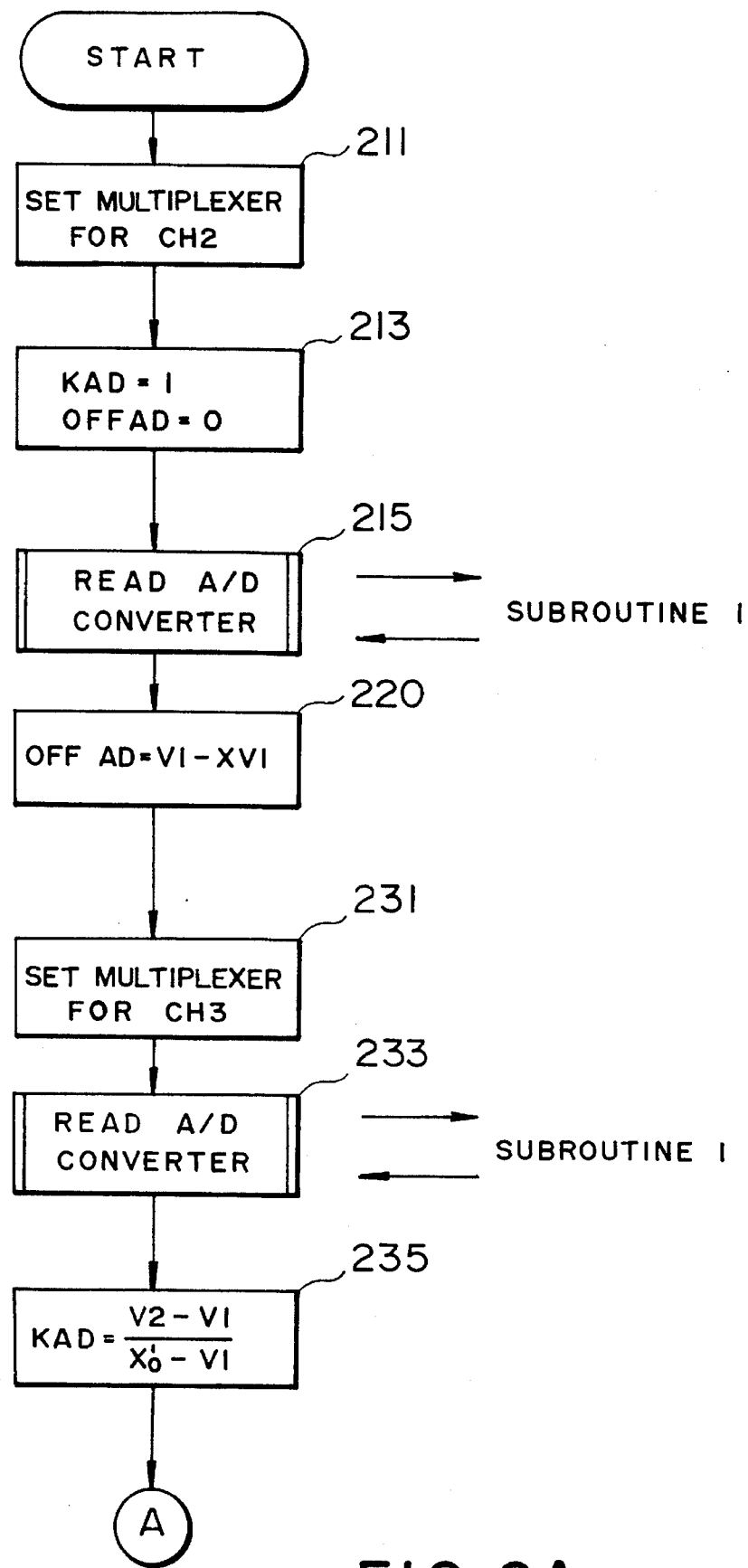
FIGS. 2A and 2B are flowcharts showing the mode of operation of the apparatus shown in FIG. 1.
Figure 2B:
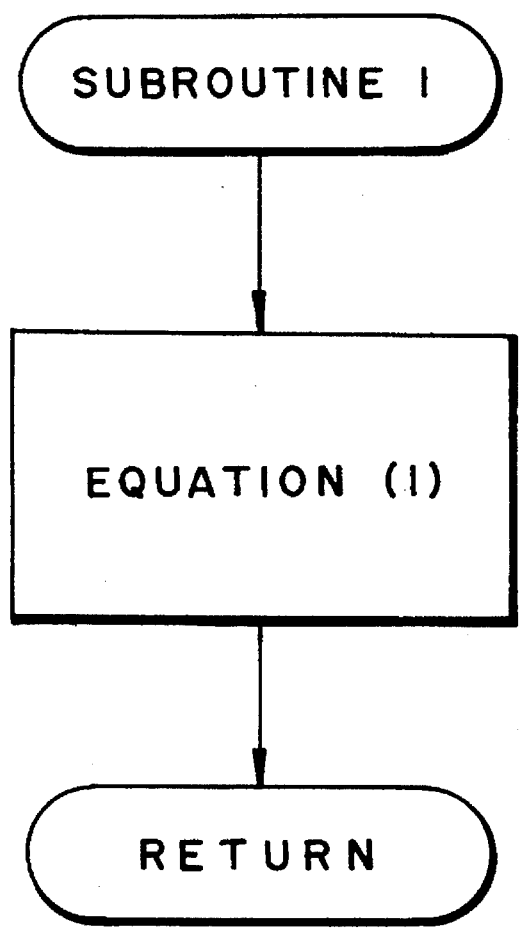

The mode of operation of the apparatus as described above will now be described. Prior to actual control operation calibration of the offset and gain for the input signal to the apparatus is performed. The flow of this operation is shown in FIGS. 2A and 2B. The power of the apparatus is first turned on to start calibration. In response to a control signal CMX from the operation processing unit CPU, the multiplexer MPX is set for the channel CH2 (step 211). Data necessary for performing the operation is loaded in the operation processing unit CPU. A gain adjustment term KAD and an offset adjustment term OFFAD in the RAM are set to 1 and 0, respectively (step 213). Upon selection of the channel CH2 of the multiplexer MPX, the reference voltage EV1 becomes the output signal SXO from the multiplexer MPX, is converted into the converted digital signal SAD by the A/D converter, and is supplied to the operation processing unit CPU. An internal code in the operation processing unit CPU for the converted reference signal SAD corresponding to the reference voltage EV1 is XV1. When the multiplexer MPX is set for the channel CH1 and a voltage V of the analog input signal SI is measured, an internal code in the operation processing unit CPU is X. An internal code corresponding to the reference voltage EV1 is V1. In this state, an operation represented by equation (1) below is performed in step 215 for the output from the A/D converter CAD according to a subprogram 1 shown in FIG. 2B.

$$Xo = KAD\{(X+OFFAD)-V1\}+V1 \qquad (1)$$

where Xo is readout output data which is obtained by calibration of an input signal X in accordance with the offset adjustment term OFFAD and the gain adjustment term KAD.

In step 213 described above, the offset adjustment term OFFAD and the gain adjustment term KAD are respectively set to 0 and 1. The reference voltage EV1 is supplied from the multiplexer MPX. Therefore, the value of the term X in equation (1) supplied from the A/D converter CAD becomes the internal code XV1.

Substitution of the values as described above in equation (1) yields the readout output data Xo given by:

$$Xo=1\{(XV1+0)-V1\}+V1=XV1 \qquad (2)$$

which is the same internal code obtainable when the reference voltage EV1, which is not subjected to calibration, is measured.

The difference between Xo and the internal code V1 corresponding to the reference voltage EV1 is the offset adjustment term. On the basis of the readout output data Xo (=XV1) of the input voltage V (=EV1) obtained in step 215, the offset adjustment term OFFAD in the RAM corresponding to the overall offset is obtained according to equation (3) below:

$$OFFAD=V-XV1 \qquad (3)$$

The offset adjustment term OFFAD is then substituted by "0" obtained in step 213 (step 220). In this manner, by performing a simple calculation in the operation processing unit CPU, the offset adjustment term OFFAD for the overall A/D conversion apparatus including an A/D converter may be performed all at once, so that adjustment for respective parts of the apparatus need not be performed. Even if the circuit conditions of the apparatus change over time and the overall offset changes, automatic offset calibration may be performed.

The gain adjustment will now be described. The multiplexer MPX is set for the channel CH3 in response to the control signal CMX from the operation processing unit CPU (step 231). The reference voltage EV2 is A/D converted, and the resultant converted digital signal SAD is supplied to the operation processing unit CPU. An internal code in the operation processing unit CPU when the reference voltage EV2 is measured is XV2. Furthermore, as has been described earlier, the internal code of the voltage V corresponding to the analog input signal SI is X, and an internal code of the voltage corresponding to the reference voltage EV2 is V2. In this state, the subprogram 1 is executed to perform a calculation in accordance with equation (1). Since the gain adjustment term KAD is 1 in the initial setting in step 213, we obtain:

$$Xo'=\{(XV2+OFFAD)-V1\}+V1 \qquad (4)$$

where Xo' is the readout output data which is subjected only to offset calibration. Since the offset adjustment term OFFAD is V1–XV1 as set in step 220, equation (4) may be rewritten as:

$$Xo'=XV2-XV1+V1 \qquad (5)$$

Thus, the relation of the values corresponding to the reference voltages EV1 and EV2 may be obtained as:

$$XV2-XV1=Xo'-V1 \qquad (6)$$

Since the readout output data Xo which is subjected both to the offset and gain calibration is equal to the internal code V2 in the general equation including a suitable gain adjustment term KAD, we obtain:

$$V2=KAD\{(XV2+OFFAD)-V1\}+V1 \qquad (7)$$

From equations (3) and (7), the gain adjustment term KAD is obtained as:

$$KAD=\frac{V2-V1}{XV2-XV1} \qquad (8)$$

Substitution of equation (6) into equation (8) above yields:

$$KAD=\frac{V2-V1}{Xo'-V1} \qquad (9)$$

When the readout output data Xo' obtained in step 233 is operated upon according to equation (9) (step 235), the gain adjustment term for A/D conversion is obtained.

In this manner, by performing a simple calculation in the operation processing unit CPU, the gain adjustment of the overall A/D conversion apparatus including the A/D converter CAD may be performed all at once. Therefore, the gains of the individual parts such as the multiplexer or the level shift circuit need not be adjusted. The changes in the gain of the apparatus with time may also be compensated for.

Figures 1, 3A:
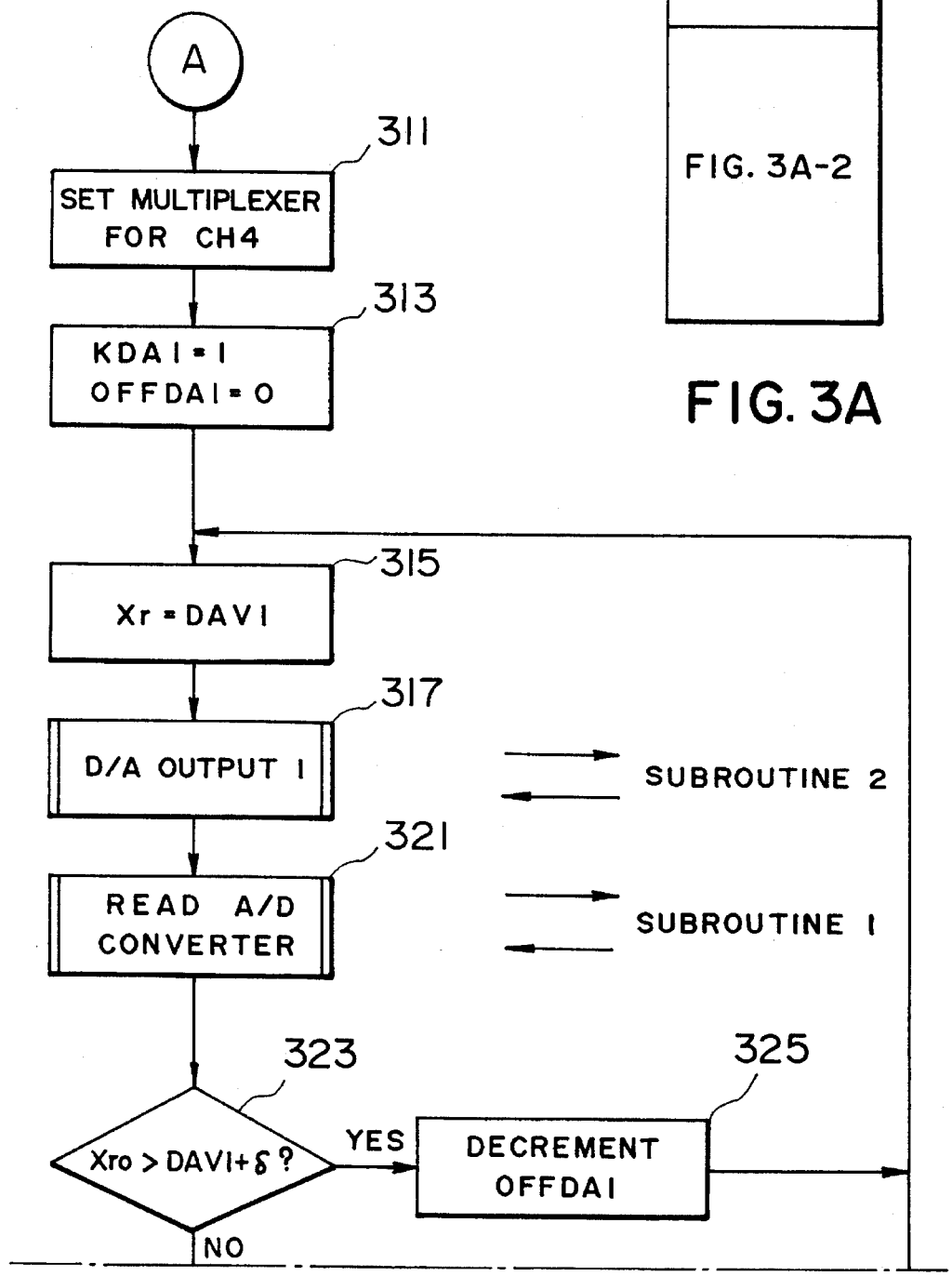
FIGS. 3A (divided into 3A-1 and 3A-2), 3B and 3C are flowcharts showing the mode of operation of the apparatus shown in FIG. 1.
Figures 2, 3A:
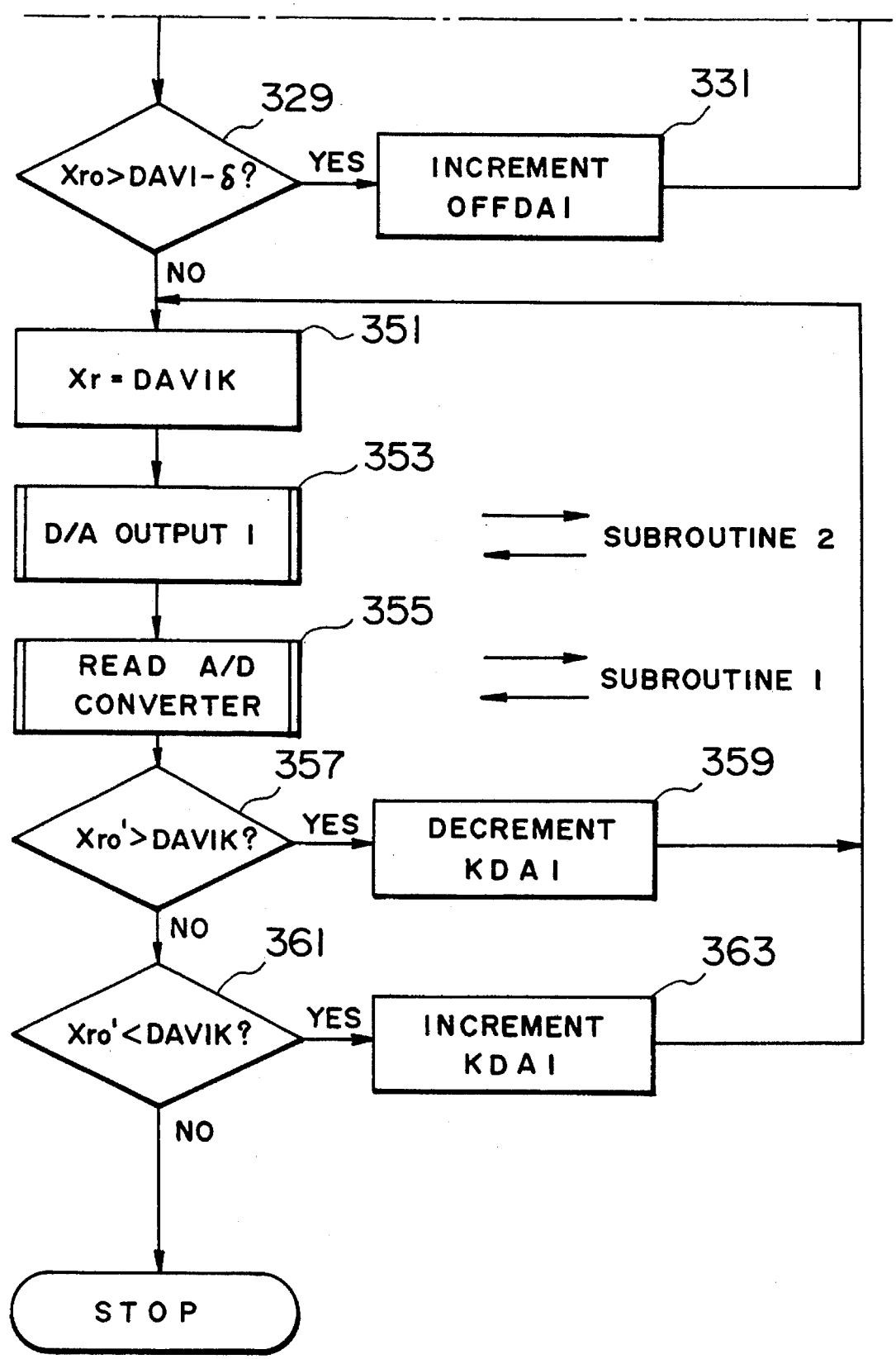
Figure 3B:
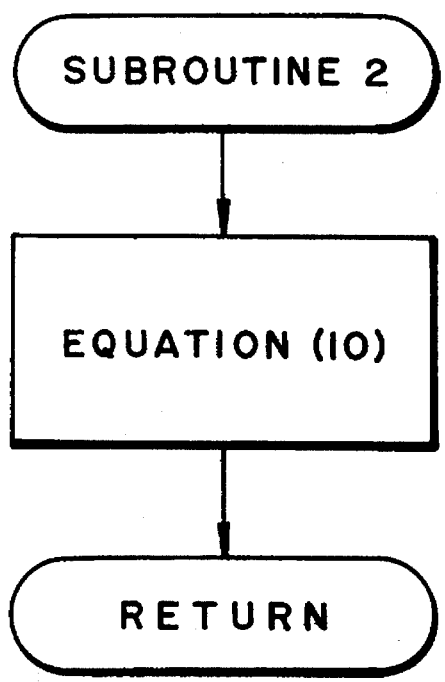
Figure 3C:
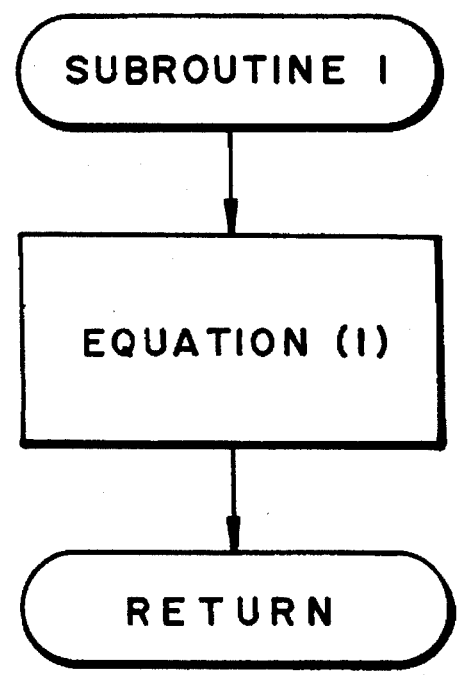

A description will now be made of calibration of the output signal of the apparatus including the D/A converter CDA and the output drivers DR1 and DR2. The flow of operation for this is shown in FIGS. 3A to 3C. The multiplexer MPX is set for the channel CH4 in response to the control signal CMX from the operation processing unit CPU (step 311), thereby the output SO1 is selected. Then, the CPU initially sets a gain adjustment term KDA1 of a D/A output 1 to 1 and an offset adjustment term OFFDA1 of the D/A output 1 to 0 in the RAM (step 313). Thereafter, data Xr to be produced in a digital form is set at a reference value DAV1 in the operation processing unit CPU (step 315). In this condition, in order to determine a suitable offset value, the calculation of equation (10) below is performed in step 317 in accordance with a subprogram 2 shown in FIG. 3B:

$$Xoo = KAD1(Xr-DAV1) + DAV1 + OFFDA1 \quad (10)$$

where Xoo is the actual output data obtained, and Xr is the data to be produced which is, in this case, DAV1. The digital signal SCR representing the data Xr is supplied to the D/A converter CDA from the operation processing unit CPU. The analog signal SA1 from the D/A converter CDA is supplied to the output driver RD1, whose output signal SO1 is supplied to the A/D converter CAD through the multiplexer MPX. The converted digital signal SAD from the A/D converter CAD is read out by the operation processing unti CPU. This reading operation is performed by executing a subprogram 1 shown in FIG. 3C in step 321. This subprogram 1 is the same as that shown in FIG. 2B. The values for the gain adjustment term KAD and the offset adjustment term OFFAD for A/D conversion which are properly set prior to step 235 are used for the calculation.

It is then discriminated if readout output data Xro is within a predetermined range (±δ) of the reference value DAV1. In other words, it is discriminated in step 323 if the readout output data Xro is greater than DAV1+δ(step 323). If YES (Xro>DAV1+δ), the offset adjustment term OFFDA1 (step 325) is decremented by a predetermined small number and the flow goes back to step 315. However, if NO in step 323 (Xro≦DAV1 +δ), it is then discriminated if the readout output data Xro is smaller than DAV1−δ(step 329). If YES (Xro<DAV1−δ), the offset adjustment term OFFDA1 (step 331) is incremented by a predetermined small number, and the flow returns to step 315 to repeat the above operation. In this manner, the calculation of equation (10) is performed according to the updated offset adjustment term OFFDA1 Of D/A conversion which is decremented in step 325 or incremented in step 331 (step 317). If |Xro−DVA1|>δ with the readout output data Xro obtained in step 321, the offset adjustment term OFFDA1 of D/A conversion is decremented (step 325) or incremented (step 331), and then the operation as described above is performed in a closed loop. When |Xro−DVA1|≦δ, YES is obtained in step 329 and the flow goes out of the loop. Thus, the offset calibration is performed for the output signal SO1 for the whole D/A converter section including the D/A converter CDA and the output driver DR1. The value of the offset adjustment term OFFDA1 at this time is provided as an optimal offset value.

In this manner, the offset adjustment of the overall D/A converter apparatus may be performed all at once by simple calculation by the operation processing unit CPU without () requiring offset adjustment of each part of the apparatus. Change in gain with time may also be compensated for.

In the state wherein the offset adjustment term OFFDA1 of D/A conversion is calibrated, the data Xr to be produced is set to DAV1K (>DAV1) by the operation processing unit CPU (step 351). Thereafter, in step 353, the subprogram 2 as shown in FIG. 3B is executed again. Output data Xoo' obtained in this case is given by:

$$Xoo' = KAD1(DAV1K-DAV1) + DAV1 = OFFDA1$$

The analog signal SO1 obtained on the basis of the data Xoo' is digitized by the A/D converter CAD through the multiplexer MPX. In response to the converted digital signal SAD, the operation processing unit CPU reads the voltage of the output signal SO1. Subsequently, the operation processing unit CPU performs a calculation of equation (1) according to the subprogram 1 shown in FIG. 3C, and readout output data Xro' is obtained (step 355). It is then discriminated if the readout output data Xro' is equal to the set value DAV1K. It is first discriminated if the data Xro' is greater than the set value DAV1K (step 357). If YES (Xro'>DAV1K), the gain adjustment term KDA1 of D/A conversion (step 359) is decremented by a predetermined small number, and the flow returns to step 351. On the other hand, if NO in step 357 (Xro'≦DAV1K), it is then discriminated if the readout output data Xro' is smaller than the set value DAV1K (step 361). If YES (Xro'<DAV1K), the gain adjustment term KDA1 of D/A conversion is incremented by a predetermined small number (step 363), and the flow returns to step 351.

In step 353, the updated data Xoo' is obtained by equation (10) in accordance with the updated value of the gain adjustment term KDA1 which is decremented in step 259 or incremented in step 363. On the basis of the resultant data Xoo', the readout output data Xro' is obtained in step 355 This operation is repeated until the data Xro' equals the set value DAV1K. When the readout output data Xro' equals the set value DAV1K, NO is obtained in step 361, and the flow goes out of the loop. In this manner, the gain adjustment term KDA1 for the whole D/A conversion apparatus including the D/A converter CDA and the output driver DR1 is calibrated, thus providing KDA1 as an optimal value.

By performing a simple calculation by the operation processing unit CPU, gain calibration of the apparatus including the multiplexer and the drivers may be performed all at once. For this reason, the adjustment of individual parts of the apparatus is unnecessary, and changes in the gain characteristics with time may be compensated for.

The flowcharts in FIGS. 3A to 3C are described with reference to calibration of the offset adjustment term OFFDA1 and the gain adjustment term KDA1 for D/A conversion of the output 1 when the multiplexer MPX is set for the channel CH4. However, similar calibration may be performed for an offset adjustment term OFFDA2 and a gain adjustment term KDA2 for D/A conversion of the output 2 from the output driver DR2 when the multiplexer MPX is set for the channel CH5. If the output signal SO2 is selected, the gain adjustment term KDA2 and the offset adjustment term OFFDA2 are initially set for the output 2 in step 313 of the flowchart shown in FIGS. 3A-1 and 3A-2. In step 351, a set value DAV2K is selected for the output 2, and a flow similar to that shown in FIGS. 3A to 3C is performed. In this manner, calibration of the offset and gain of the D/A conversion path including the D/A converter CDA, the output drivers and the channel CH4 of the multiplexer MPX is performed.

The present invention eliminates the problems of the prior art apparatuses and may be applied to a data processing apparatus which performs A/D conversion and D/A conversion such as a copying apparatus.

In the embodiment described above, the operation processing unit CPU comprises a one-chip microcomputer to which an A/D converter and a D/A converter are externally attahed. However, the operation processing unit CPU may comprise a microcomputer which incorporates one or both of the A/D converter and the D/A converter.

What we claim is:

1. An apparatus for outputting an analog control signal to control a controlled means on the basis of an analog input signal, said apparatus comprising:

first converting means for converting the analog input signal into a digital signal;

a central processing unit for generating a digital control signal on the basis of the digital signal;

second converting means for converting the digital control signal generated by said central processing unit into an analog control signal; and supplying means for selectively supplying one of the analog input signal, an analog reference signal and a feedback signal to said first converting means;

wherein, prior to outputting the analog control signal on the basis of the analog input signal, said central processing unit causes said supplying means to supply the analog reference signal to said first converting means, recognizes a first error in said first converting means on the basis of the digital signal from said first converting means, causes said supplying means to supply the feedback signal to said first converting means, outputs a digital reference signal to said second converting means so as to generate the feedback signal, and recognizes a second error in said second converting means on the basis of the digital signal from said first converting means and the first error; and wherein when said apparatus outputs the analog control signal on the basis of the analog input signal, said central processing unit causes said supplying means to supply the analog input signal to said first converting means, and processes the digital signal from said first converting means in accordance with the first error and the second error so as to generate the digital control signal.

2. An apparatus according to claim 1, wherein said supplying means selectively supplies one of a first analog reference signal and a second analog reference signal to said first converting means prior to outputting the analog control signal to control the controlled means; and wherein said central processing unit recognizes an offset error in said first converting means on the basis of the digital signal, and recognizes a gain error in said first converting means on the basis of the digital signal.

3. An apparatus according to claim 2, wherein said central processing unit (1) outputs to said second converting means, prior to outputting an analog control signal to control the controlled means, a first digital reference signal and a second digital reference signal, the first digital reference signal and the second digital reference signal being converted into a first feedback signal and a second feedback signal, respectively, by said second converting means, (2) recognizes an offset error in said second converting means on the basis of the first error, the first digital reference signal and the digital signal, and (3) recognizes a gain error in said second converting means on the basis of the offset error, the first error, the second digital reference signal and the digital signal.

4. An apparatus according to claim 1, wherein the analog input signal is one of a power source voltage, a driven part of an operational signal and a detection signal.

5. An apparatus according to claim 1, wherein the controlled means comprises one of a high voltage transformer, a motor and a lamp.

6. A method of controlling a controlled means on the basis of an analog input signal using an apparatus comprising a first converting means for converting the analog input signal into a digital signal, and a second converting means for converting a digital control signal generated on the basis of the digital signal into an analog control signal, said method comprising:

a first supplying step for supplying an analog reference signal to the first converting means prior to controlling the controlled means based on the analog input signal;

a first recognizing step for recognizing a first error in the first converting means on the basis of the digital signal from said first converting means;

an outputting step for outputting a digital reference signal to the second converting means so as to generate a feedback signal;

a second supplying step for supplying the feedback signal to said first converting;

a second recognizing step for recognizing a second error in said second converting means on the basis of the digital signal from said first converting means and the first error;

a third supplying step for supplying the analog input signal to said first converting; and a generating step for generating the digital control signal through processing, including processing the digital signal from said first converting means according to the first error and the second error.

7. A method according to claim 6, wherein said first recognizing step comprises recognizing an offset error in said first converting means on the basis of the digital signal, and recognizing a gain error in said first converting means on the basis of the digital signal.

8. A method according to claim 7, wherein said outputting step comprises outputting a first digital reference signal and a second digital reference signal to said second converting means which converts the first digital reference signal and the second digital reference signal to a first feedback signal and a second feedback signal, respectively; and wherein said second recognizing step comprises (1) recognizing an offset error in said second converting means on the basis of the first error, the first digital reference signal and the digital signal, and (2) recognizing a gain error in said second converting means on the basis of the offset error, the first error, the second digital reference signal and the digital signal.

9. A method according to claim 6, wherein the analog input signal is one of a power source voltage, a driven part of operational signal and a detection signal.

10. A method according to claim 6, wherein the controlled means is one of a high voltage transformer, a motor and a lamp.

* * * * *

UNITED STATES PATENT AND TRADEMARK OFFICE
CERTIFICATE OF CORRECTION

PATENT NO. : 5,610,810

DATED : March 11, 1997

INVENTORS : Jyoji Nagahira et al.

It is certified that error appears in the above-identified patent and that said Letters Patent is hereby corrected as shown below:

On the cover page:

Under [30] Foreign Application Priority Data,
"Sep. 6, 1981" should read --Sep. 9, 1981--.

COLUMN 5

Line 24, "unti" should read --unit--;
Line 44, "Of" should read --of--; and
Line 59, "without ()" should read --without--.

Signed and Sealed this

Sixteenth Day of September, 1997

Attest:

BRUCE LEHMAN

Attesting Officer

Commissioner of Patents and Trademarks